United States Patent [19]
Sano

[11] Patent Number: 5,969,799
[45] Date of Patent: *Oct. 19, 1999

[54] EXPOSURE APPARATUS WITH A PULSED LASER

[75] Inventor: Naoto Sano, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/577,474

[22] Filed: Dec. 22, 1995

[30] Foreign Application Priority Data

Dec. 26, 1994 [JP] Japan .................................. 6-338191

[51] Int. Cl.$^6$ ............................... G03B 27/54; H01S 3/13
[52] U.S. Cl. ............................ 355/53; 355/67; 430/30; 372/20; 372/30
[58] Field of Search .............................. 355/18, 53, 67, 355/77; 430/30, 396; 356/229; 372/30, 20

[56] References Cited

U.S. PATENT DOCUMENTS

| | | |
|---|---|---|
| 4,811,055 | 3/1989 | Hirose . |
| 4,905,041 | 2/1990 | Aketagawa . |
| 4,968,868 | 11/1990 | Aketagawa ........................ 219/121.68 |
| 5,121,160 | 6/1992 | Sano et al. . |
| 5,250,797 | 10/1993 | Sano et al. . |
| 5,373,515 | 12/1994 | Wakabayashi et al. ................... 372/20 |

FOREIGN PATENT DOCUMENTS 6-2600702  9/1994  Japan .

OTHER PUBLICATIONS

"Radiometry", vol. 1 of Optical Radiation Measuremnets, by Franc Grum and Richard Becherer, Academic Press, Orlando (1979), p. 147.

*Primary Examiner*—Marion McCamish
*Assistant Examiner*—Cheryl Juska
*Attorney, Agent, or Firm*—Fitzpatrick, Cella, Harper & Scinto

[57] ABSTRACT

An exposure apparatus comprising (a) irradiating means for illuminating a mask with laser light from an excimer laser and (b) a projection optical system for projecting a pattern of the mask onto a substrate with the laser light, wherein a characteristic of the projection optical system is measured by use of a harmonic of a predetermined laser, and wherein the laser light from the excimer laser has a wavelength corresponding to that of the harmonic of the predetermined laser.

15 Claims, 5 Drawing Sheets

EXPOSURE APPARATUS WITH A PULSED LASER

FIELD OF THE INVENTION AND RELATED ART

This invention relates generally to an exposure apparatus and a device manufacturing method using the same. More particularly, the invention is concerned with an exposure apparatus such as a stepper, for example, and a device manufacturing method using the same, suitably applicable to manufacture of various devices such as ICs, LSIs, CCDs, liquid crystal panels or magnetic heads, by, for example, illuminating a circuit pattern of a reticle with pulse light from an excimer laser, for example, and by projecting the illuminated circuit pattern on a wafer.

Recently, in an exposure method using an ultra-high pressure Hg lamp, various attempts have been made to enhance the resolution by changing the exposure wavelength to i-line from g-line. Also, many proposals have been made to use pulse light of a shorter wavelength, as represented by an excimer laser, to increase the resolution. The use of short wavelength light is effective to enlarge the depth of focus with the reduction in wavelength, to thereby improve the resolution.

The emission spectrum of an excimer laser, in a case of a KrF excimer laser, for example, is about 300 pm (full width at half maximum), and this is sufficiently small as compared with the full width wavelength of light from conventional ultra-high pressure Hg lamps. Taking the quality into account, the optical material usable in a reduction projection lens of an exposure apparatus which uses light in the deep ultraviolet region might be synthetic quartz or fluorite only. For this reason, taking chromatic aberration into account, even with a spectral band width of 300 pm, which is sufficiently small as compared with that of ultra-high pressure Hg lamps, the band width has to be reduced (band-narrowed) further by about two digits. Namely, the full width at half maximum has to be not greater than 3 pm (0.003 nm).

For reduction of the spectral band width, generally, a band narrowing unit having a dispersion element such as an etalon or grating is used to band narrow a laser light to a spectral band width of about 1 pm. While the emission center wavelength of the thus band narrowed laser light may differ with the laser medium used, usually a wavelength which is in the vicinity of the emission gain by which a maximum output is obtainable is selected. For example, in a case of KrF excimer laser, it is close to 248.35 nm, which is the center of the emission gain On the other hand, recent semiconductor device manufacturing apparatuses are required to provide a high resolution and yet a high throughput. Generally, the resolution depends on the numerical aperture (N.A.) of a projection lens system. Further, for higher throughput, the size of a chip has become larger. This necessitates a projection lens system having a large N.A. and yet a wide field angle.

However, enlargement of the N.A. or the field angle of a projection lens system directly leads to a difficulty in lens design. Also, it results in narrowed tolerance to production, making the lens manufacture more difficult. For manufacture of a projection lens system, generally, a number of lenses are combined into a projection lens, and trial printing tests are carried out by using that projection lens system. Aberrations of the projection lens system are detected on the basis of the results of trial printing, and correction of the lens system is performed. However, this process needs the skill of an operator and takes much time. Thus, the throughput is low. Also, it is practically difficult to correct all products (projection lens systems) precisely and exactly.

As for a method of quantitatively measuring the performance of a projection lens system having a combination of a number of lenses, there is a method in which an interferometer is used to detect aberrations and, on the basis of the detection, the lens system is corrected. Interferometers use a laser as a light source. However, in a case where an excimer laser is used in an exposure apparatus as a light source, there would be no laser source which is suitably usable in an interferometer and which has the same wavelength as that of the excimer laser. An excimer laser of the type used in the exposure apparatus may be used as a light source for the interferometer. However, the coherency of excimer lasers is not high, and they are not suited to be used as a light source of an interferometer. Additionally, because excimer lasers provide pulsed light emission, stabilization of outputs is difficult to attain. Thus, with an interferometer using an excimer laser, it is difficult to obtain good precision in inspection of the performance of a high-quality projection lens system having a large N.A. and/or a large field angle.

Gas lasers such as a He—Ne laser have good coherency and they provide continuous wave emission. Thus, gas lasers may suitably be used as a light source of an interferometer. However, their wavelength differs considerably from that of excimer lasers. Thus, while taking chromatic aberration or film characteristics into account, it is difficult to use gas lasers for inspection of a projection lens system designed for use with the wavelength of an excimer laser.

In the vicinity of 248.35 nm, which is the center wavelength of an ordinary KrF excimer laser, there is a double harmonic wave (a wave having a wavelength a half of its original wavelength) of an argon ion laser, which can be produced by using a secondary harmonic wave producing element. However, such harmonics have a wavelength of about 100 pm which is quite different from that of the KrF excimer laser. Thus, it can not be used as a light source for an interferometer for inspection of a projection lens system designed for use with a band narrowed excimer laser.

SUMMARY OF THE INVENTION

It is accordingly an object of the present invention to provide an improved exposure apparatus.

It is another object of the present invention to provide an improved device manufacturing method.

In accordance with an aspect of the present invention, there is provided an exposure apparatus, comprising: irradiating means for projecting pulse light to a mask; and a projection optical system for projecting a pattern of the mask onto a substrate, wherein the pulse light has an adjusted wavelength such that it substantially coincides with a wavelength of laser light of a continuous wave.

In accordance with another aspect of the present invention, there is provided an exposure apparatus, comprising: an irradiation optical system for projecting pulse light of a wavelength 248.25 nm to a mask; and a projection optical system for projecting a pattern of the mask onto a substrate.

In accordance with a further aspect of the present invention, there is provided a device manufacturing method, comprising the steps of: providing a light source adapted to supply pulse light of a wavelength 248.25 nm; and projecting the pulse light to a mask so that a pattern of the mask is projected through a projection optical system to a substrate.

In accordance with a yet further aspect of the present invention, there is provided a device manufacturing method, comprising the steps of: providing a light source adapted to supply pulse light; and projecting the pulse light to a mask so that a pattern of the mask is projected through a projection optical system to a substrate, wherein the pulse light has an adjusted wavelength such that it substantially coincides with a wavelength of laser light of a continuous wave.

The projection optical system to be used in the present invention may include a lens assembly, a mirror assembly or a combination of a concave mirror and a lens assembly.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
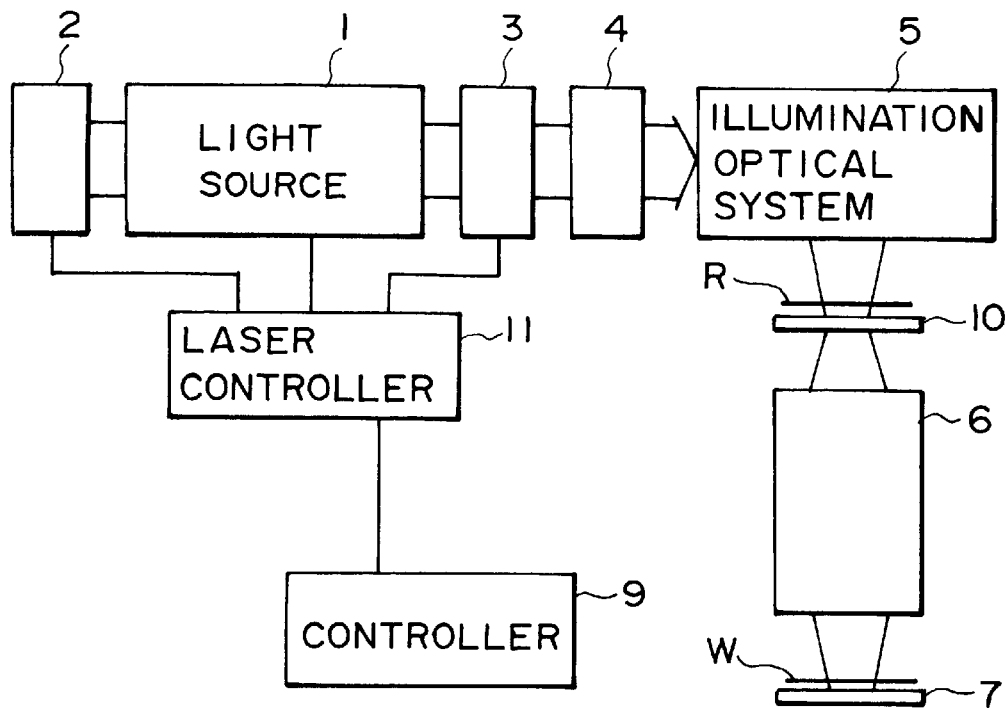
FIG. 1 is a schematic and diagrammatic view of a main portion of an exposure apparatus according to an embodiment of the present invention.

FIG. 1 is a schematic and diagrammatic view of a main portion of an exposure apparatus according to a first embodiment of the present invention. Denoted in the drawing at 1 is light source means which comprises, for example, a KrF excimer laser for providing pulsed laser light. This excimer laser 1 provides pulse light of a wavelength of about 248 nm in the deep ultraviolet region. Denoted at 2 is a band narrowing unit which includes a band narrowing element, such as an etalon or grating, for example, for band narrowing the laser light from the excimer laser 1. Denoted at 3 is a wave meter for detecting the wavelength of pulse light from the excimer laser 1, and denoted at 4 is a beam shaping optical system which serves to expand the beam diameter of the laser light. Denoted at 5 is an illumination optical system for uniformly illuminating a device pattern on the surface (surface to be illuminated) of a reticle R, placed on a reticle stage 10, with the laser light from the beam shaping optical system 4. Through this illumination optical system 5, the reticle surface is illuminated with uniform illuminance distribution.

Denoted at 6 is a projection optical system (projection lens system) for projecting, in a reduced scale, the circuit pattern (device pattern) on the reticle R surface onto the surface of a wafer W placed on a wafer stage 7. Denoted at 9 is a controller which is operable to set and control various process conditions necessary for the projection exposure of the wafer W surface. Denoted at 11 is a laser controller for controlling the light source means 1 and the band narrowing unit 2 in accordance with the process conditions, set by the controller 9, so that the light source 1 provides pulse laser light of a predetermined wavelength.

In this embodiment, for setting process conditions necessary for projection of the circuit pattern, on the reticle R surface, onto the wafer W surface, for exposure of the latter, initially an operator inputs, into the controller 9, the necessary resolution as required for the projection exposure as well as the necessary pulse energy and pulse number as calculated from, for example, the sensitivity of a resist applied to the wafer W. In response, in accordance with the applied process conditions, the controller 9 operates to determine optimum or desirable conditions for the emission of laser light from the light source means 1.

The emission conditions may include the energy of laser light per pulse, the emission frequency and the emission center wavelength, for example. The center wavelength of the laser light to be emitted may be at a level as automatically set by the laser controller 11, or it may be at a level once set by the controller 9 and then transmitted to the laser controller 11. The laser controller 11 continuously monitors the emitted laser light by use of the wave meter 3 so that the emission wavelength from the excimer laser 1 is maintained at the set emission wavelength. Also, the laser controller 11 controls the band narrowing element (not shown) within the band narrowing unit 2, so that the wavelength of the pulse laser light is controlled at the set wavelength.

As regards the center wavelength to be set by the controller 9, in this embodiment, in a case where the light source means 1 used in the exposure apparatus comprises a KrF excimer laser, it is set at a wavelength 248.25 nm which corresponds to the wavelength of the double or secondary harmonics of an argon ion laser (wavelength 496.5 nm) of a continuous emission type. While an argon ion laser have several emission lines, a wavelength of double harmonics of 496.5 nm having a relatively high power is close to the emission wavelength of the KrF excimer laser. Thus, the wavelength of exposure light in the exposure apparatus of this embodiment is adjusted or registered with that wavelength.

Figure 2:
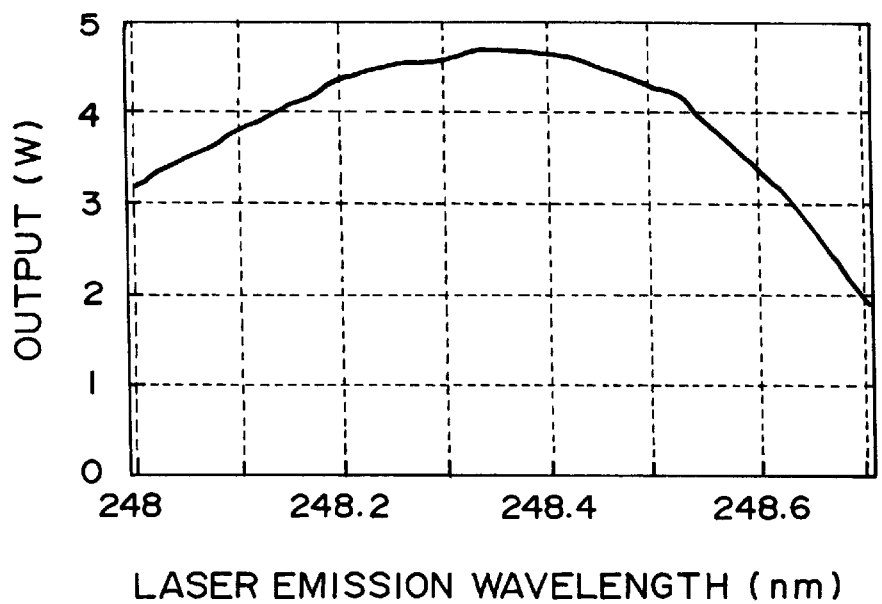
FIG. 2 is a graph for explaining the relation between the output and the emission wavelength of a laser light source, in an embodiment of the present invention.

The wavelength by which a maximum output is obtainable from the excimer laser 1, having been band narrowed by the band narrowing unit 2, is about 248.35 nm which is at the center of gain. Thus, setting the emission wavelength of the excimer laser 1 at 248.25 nm results in a deviation of the wavelength by about 0.1 nm from the wavelength by which a maximum output is obtainable. However, according to experiments made by the inventors of the subject application, a relation such as illustrated in FIG. 2 has been obtained between the laser emission wavelength and the output.

More specifically, it has been found that, in a band narrowed KrF excimer laser, even if the set emission wavelength deviates by an order of 0.1 nm from the wavelength by which a maximum output is attainable, there occurs only a small drop in output of about a few percent. Generally, in exposure apparatuses, a large decrease in output leads to reduced illuminance on an image plane or degraded resolution, and it causes a serious problem. However, the small decrease of output found by the inventors can be easily compensated for by setting the optical system appropriately.

In this embodiment, the design wavelength of the projection optical system 6 and the emission wavelength of the light source means 1 are registered with the wavelength of a high coherency and a continuous emission laser light source, for example, the wavelength of double harmonics (continuous wave) of laser light from an argon ion laser. Namely, the emission wavelength of the excimer laser is adjusted and registered with the wavelength of light from an argon ion laser. Several methods are applicable to registration of the wavelength to these lasers (the argon ion laser is provided with harmonic wave producing means). An example is that both the light from an argon ion laser and the light from an excimer laser are inputted into a spectroscope and, while comparing the difference therebetween, wavelength registration may be done. As an alternative, the arrangement shown in FIG. 3, to be described below, may be used.

Figure 3:
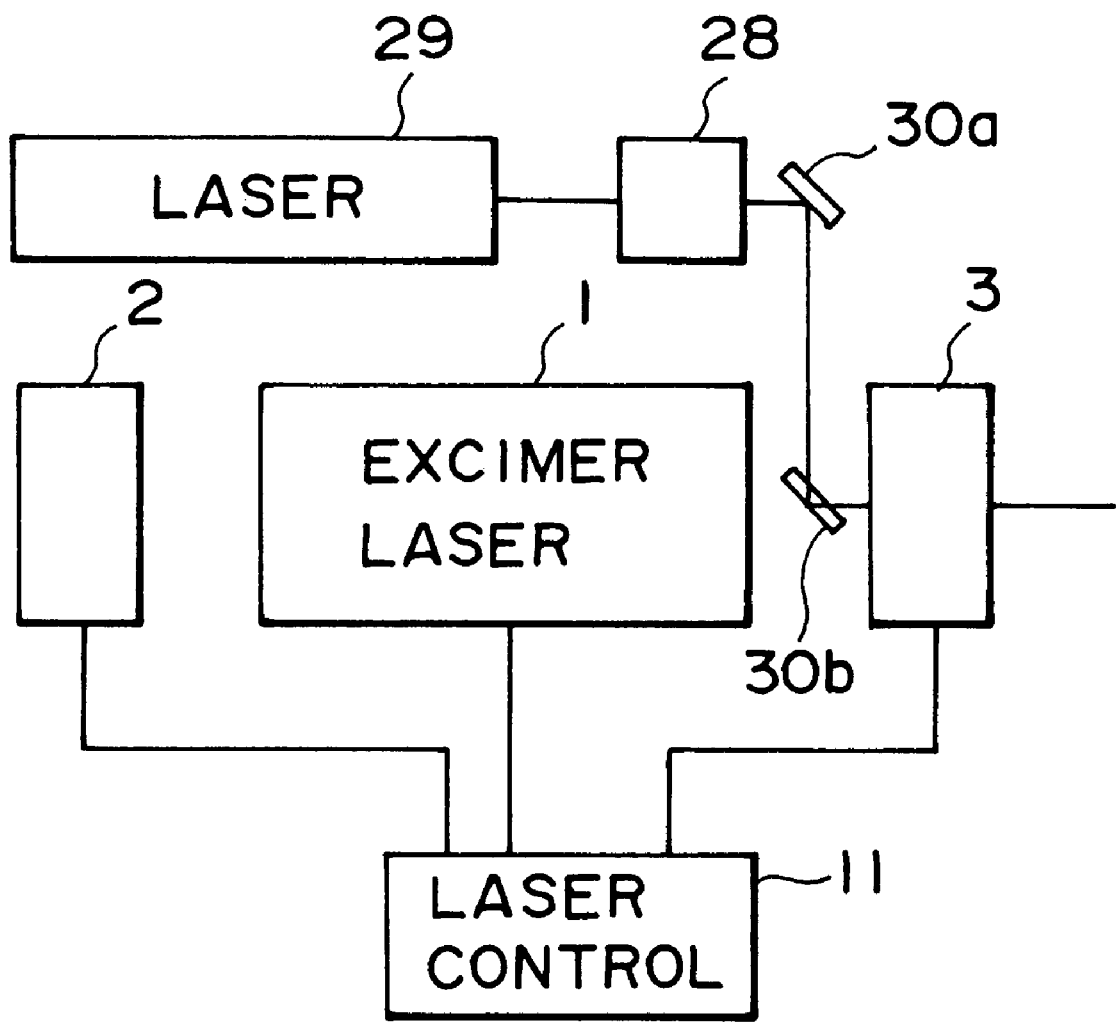
FIG. 3 is a schematic and diagrammatic view of a main portion of an embodiment of the present invention.

In FIG. 3, laser light from an argon ion laser 29 is wavelength-transformed by means of a wavelength transforming device 28, having a secondary harmonic wave producing element, by which a secondary harmonic wave is produced. This secondary harmonic wave is then reflected by mirrors 30a and 30b, and is it projected to a wave meter 3. By using this wave meter 3, the wavelength of the laser light coming from the system including the argon ion laser 29 and the wavelength transforming device 28 is measured. With the thus detected wavelength, the wavelength of laser light from the excimer laser 1 is adjusted and registered.

Figure 4:
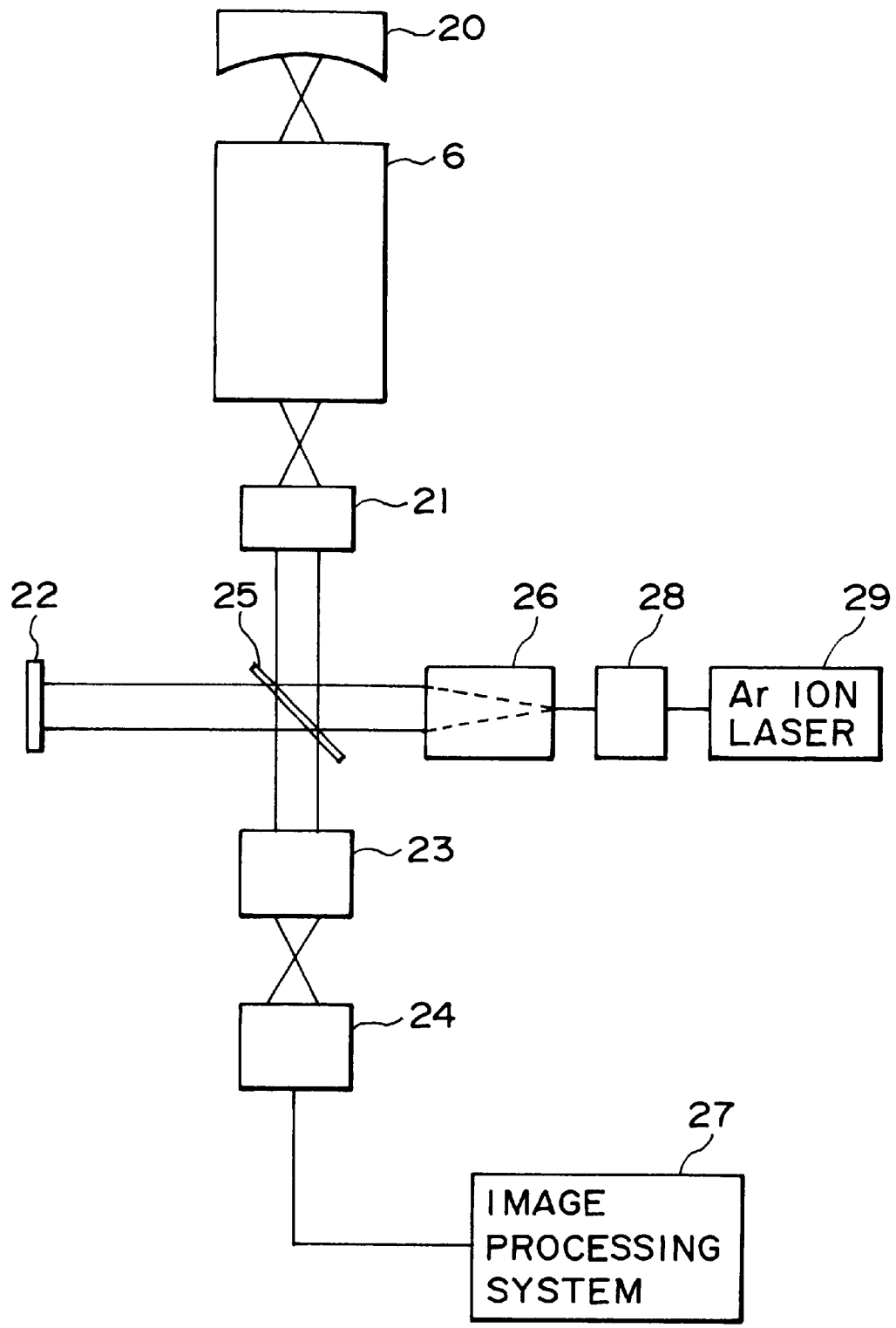
FIG. 4 is a schematic and diagrammatic view of a main portion of an embodiment of the present invention.

FIG. 4 an embodiment of an interferometer system, wherein the emission wavelength of a KrF excimer laser for providing pulse light with a center wavelength 248.25 nm, to be used in an exposure apparatus, is adjusted and registered with the wavelength of a double harmonics of a continuous emission type argon ion laser 29, having high coherency, and wherein by using the secondary harmonic wave from the argon ion laser the optical performance of the projection optical system 6 is measured. In FIG. 4, the laser light of a wavelength 496.5 nm from the argon ion laser 29 is wavelength-transformed by a wavelength transforming device 28, whereby a secondary harmonic wave (wavelength 248.25 nm) of the same or substantially the same wavelength as the KrF excimer laser is produced. It is then directed to a collimator lens 26 by which it is shaped into a desired beam diameter. Then, the light impinges on a half mirror 25.

The half mirror 25 reflects a portion of the received laser light, and this portion of the light is collected by a collimator lens 21 and is directed to the projection optical system 6. The projection optical system 6 collects the received light, and the collected light is then reflected by a spherical mirror 20 such that the light goes back along its oncoming path. The light then passes the half mirror 25, and by means of an imaging lens 23 the light is projected on the surface of a CCD camera 24, as measurement light.

On the other hand, the remaining portion of the laser light impinging on the half mirror 25 passes it. The remaining portion of the light, transmitted through the half mirror, is reflected by a reference mirror 22 such that the light goes back along its oncoming path. The light is then reflected by the half mirror 25 and, by means of the imaging lens 23, it is projected on the surface of the CCD camera 24 as reference light.

The image as formed on the camera 24, based on the two light fluxes of measurement light and reference light provides an interference fringe (resulting from interference between the two light fluxes) which bears information related to aberration, for example, of the projection optical system 6. The interference fringe is analyzed by an image processing system 27, by which aberrations and the like of the projection optical system 6 are detected. Based on this detection, the optical performance of the projection optical system 6 is measured. Thus, the optical performance of the projection optical system can be well adjusted on the basis of the stabilized laser light as has been described, such that high resolution pattern printing is assured with the thus adjusted projection optical system.

Next, an embodiment of device manufacturing method which uses an exposure apparatus as has been described in the foregoing, will be explained. In this embodiment, the invention is applied to the manufacture of semiconductor devices.

Figure 5:
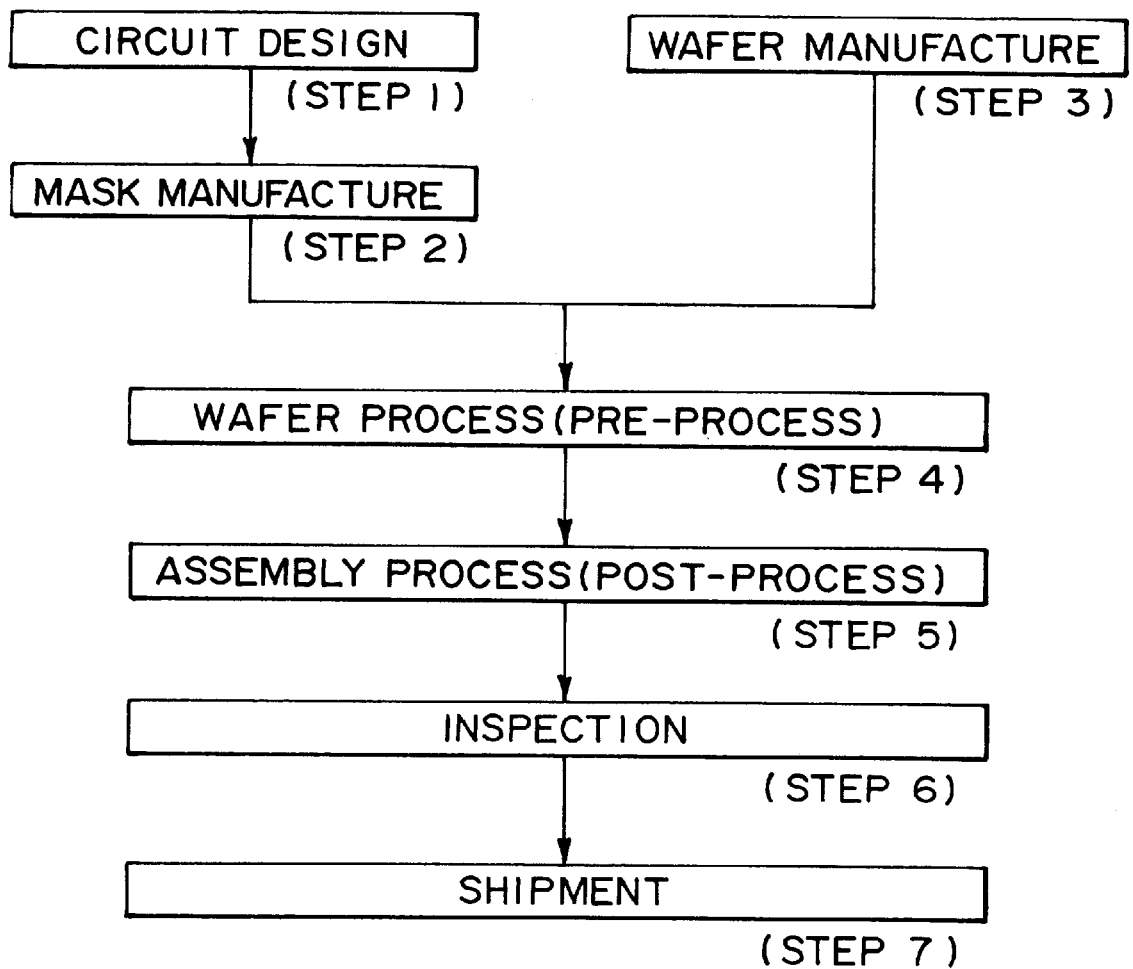
FIG. 5 is a flow chart of device manufacturing processes, in an embodiment of the present invention.

FIG. 5 is a flow chart of the sequence of manufacturing a semiconductor device, such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process, wherein the wafer processed by step 4 is formed into semiconductor chips. This step includes assembling (dicing and bonding) and packaging (chip sealing). Step 6 is an inspection step wherein an operability check, a durability check, and so on, of the semiconductor devices produced by step 5 are carried out. With these processes, semiconductor devices are finished and they are shipped (step 7).

Figure 6:
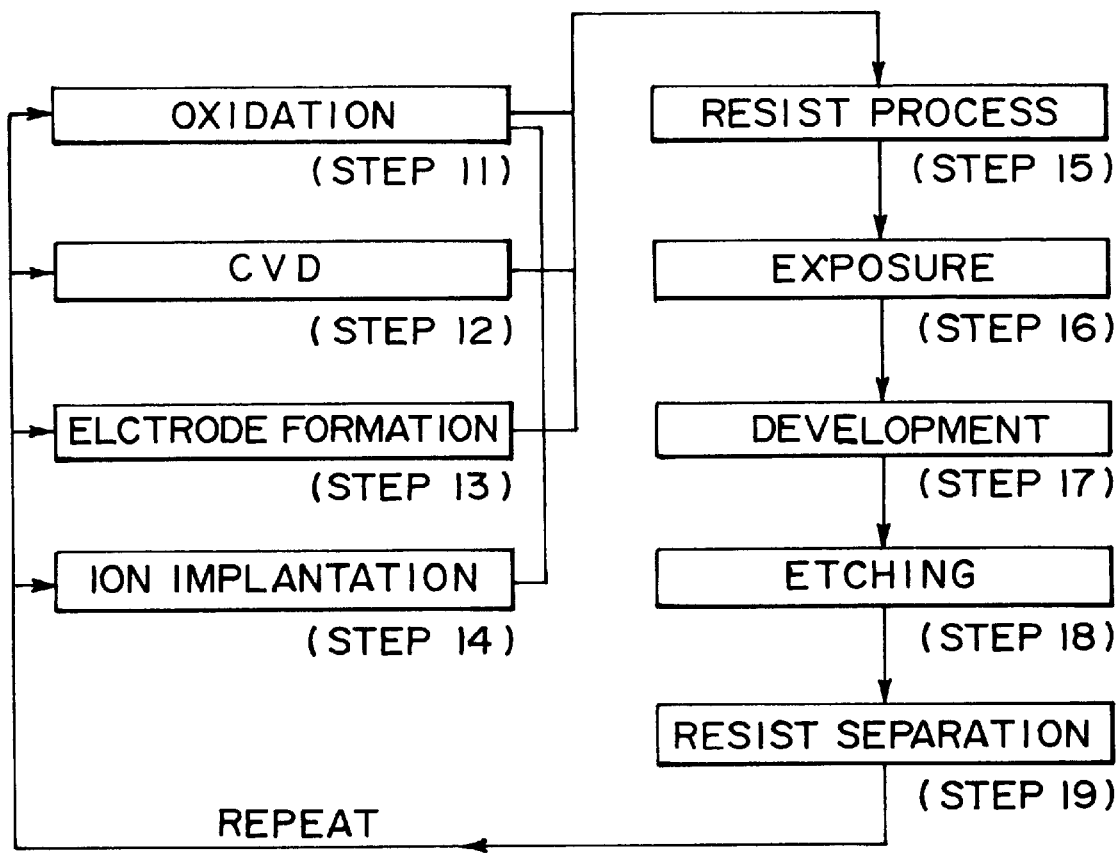
FIG. 6 is a flow chart of a wafer process, in the sequence of FIG. 5.

FIG. 6 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In the embodiments described hereinbefore, the projection optical system has a lens assembly. However, it is within the scope of the present invention to use a projection optical system having a mirror assembly or a projection optical system having a concave mirror and a lens assembly.

Further, while in the foregoing embodiments the wavelength of a secondary harmonic wave of an argon ion laser is applied as the measurement wavelength of an interferometer, if the design wavelength of a projection optical system differs from that of the embodiments, the measurement wavelength should be changed with respect to the design wavelength. In that case, the wavelength of a secondary harmonic wave or tertiary harmonic wave of laser light from an argon laser or from any other gas laser may be used as the measurement wavelength, and the wavelength of a pulse light source to be used for the exposure process may be adjusted and registered to the measurement wavelength.

Further, in the foregoing embodiments the invention has been described with reference to a step-and-repeat type exposure apparatus (stepper). However, the invention is applicable also to a step-and-scan type scanning exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

means for illuminating a mask with light from an excimer laser; and a projection optical system for projecting a pattern of the mask onto a substrate with the light from the excimer laser, wherein optical performance of said projection optical system is measured by forming an interference fringe, containing information related to aberration of said projection optical system, by use of a secondary harmonic wave of a laser separate from said excimer laser, and then by analyzing the interference fringe, and wherein the light from the excimer laser has a wavelength corresponding to that of the harmonic of the laser separate from the excimer laser.

2. A system according to claim 1, wherein said projection optical system includes a lens assembly.

3. An apparatus according to claim 1, wherein said projection optical system includes a concave mirror and a lens assembly.

4. An apparatus according to claim 1, wherein said projection optical system includes a mirror assembly.

5. An apparatus according to claim 1, wherein the harmonic is a secondary harmonic.

6. An apparatus according to claim 1, wherein the predetermined laser is a continuous emission laser.

7. An apparatus according to claim 6, wherein the harmonic is a secondary harmonic.

8. An apparatus according to claim 6, wherein the continuous emission laser comprises a gas laser.

9. An apparatus according to claim 1, wherein said illuminating means comprises said excimer laser and means for band-narrowing the laser light from said excimer laser.

10. An exposure apparatus comprising:

illuminating means for illuminating a mask with light from a KrF excimer laser; and a projection optical system for projecting a pattern of the mask onto a substrate with the light from the excimer laser, wherein optical performance of said projection optical system is measured by forming an interference fringe, containing information related to aberration of said projection optical system, by use of a secondary harmonic wave of an Argon laser, and then by analyzing the interference fringe, and wherein the light from the KrF excimer laser has a wavelength corresponding to that of the secondary harmonic of the Argon laser.

11. An apparatus according to claim 10, wherein said projection optical system includes a lens assembly.

12. An apparatus according to claim 10, wherein said projection optical system includes a concave mirror and a lens assembly.

13. An apparatus according to claim 10, wherein said projection optical system includes a mirror assembly.

14. An exposure apparatus, comprising:

illuminating means for illuminating a mask with light from a first laser; and a projection optical system for projecting a pattern of the mask onto a substrate with the light from the first laser, wherein optical performance of said projection optical system is measured by forming an interference fringe, containing information related to aberration of said projection optical system, by use of light from a second laser having higher coherency than said first laser, and then by analyzing the interference fringe, and wherein the wavelength of the light from the first laser is registered with that of the harmonic of the second laser.

15. An apparatus according to claim 14, wherein the first laser comprises a pulse laser, and wherein the second laser comprises a continuous wave laser.

* * * * *

UNITED STATES PATENT AND TRADEMARK OFFICE
CERTIFICATE OF CORRECTION

PATENT NO. : 5,969,799

DATED      : October 19, 1999

INVENTOR(S): NAOTO SANO

Page 1 of 2

It is certified that error appears in the above-identified patent and that said Letters Patent is hereby corrected as shown below:

ON THE COVER PAGE:
Under "FOREIGN PATENT DOCUMENTS": "6-2600702" should read --6-260702--; and
Under "OTHER PUBLICATIONS": "Optical Radiation Measuremnets," should read --Optical Radiation Measurements,--.

IN THE DISCLOSURE:
COLUMN 4:
Line 15, "once" should read --first--; and
Line 29, "have" should read --may have--.

COLUMN 5:
Line 13, "is it" should read --it is--; and
Line 19, "4" should read --4 shows--.

UNITED STATES PATENT AND TRADEMARK OFFICE
CERTIFICATE OF CORRECTION

PATENT NO. : 5,969,799

DATED : October 19, 1999

INVENTOR(S): NAOTO SANO

It is certified that error appears in the above-identified patent and that said Letters Patent is hereby corrected as shown below:

COLUMN 8:
Line 10, "Argon" should read --argon--;
Line 14, "Argon" should read --argon--; and
Line 30, "light from a" should read --a harmonic of a--.

Signed and Sealed this

Twelfth Day of September, 2000

Attest:

Q. TODD DICKINSON

Attesting Officer     Director of Patents and Trademarks